(12) United States Patent
Moffatt et al.

(10) Patent No.: US 9,557,111 B2
(45) Date of Patent: Jan. 31, 2017

(54) AMBIENT LAMINAR GAS FLOW DISTRIBUTION IN LASER PROCESSING SYSTEMS

(75) Inventors: Stephen Moffatt, St. Brelade (JE); Aaron Muir Hunter, Santa Cruz, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 803 days.

(21) Appl. No.: 13/204,068

(22) Filed: Aug. 5, 2011

(65) Prior Publication Data

US 2012/0214112 A1    Aug. 23, 2012

Related U.S. Application Data

(60) Provisional application No. 61/444,973, filed on Feb. 21, 2011.

(51) Int. Cl.
*F27D 5/00* (2006.01)
(52) U.S. Cl.
CPC .................................. *F27D 5/0037* (2013.01)
(58) Field of Classification Search
CPC ..... F27D 5/0037; B23K 26/14; B23K 26/123; B23K 26/1405; H01L 21/67115; H01L 21/0262; H01L 21/02529; H01L 21/2026
USPC ........................ 219/74, 121.11–144; 432/253
See application file for complete search history.

(56) References Cited

U.S. PATENT DOCUMENTS

| | | | |
|---|---|---|---|
| 5,558,717 A | 9/1996 | Zhao et al. | |
| 5,997,963 A | 12/1999 | Davison et al. | |
| 6,542,220 B1 | 4/2003 | Schrijver et al. | |
| 6,642,996 B2 | 11/2003 | Nogawa | |
| 6,665,046 B2 | 12/2003 | Nogawa et al. | |
| 6,707,530 B2 | 3/2004 | Schriver et al. | |
| 6,926,801 B2 | 8/2005 | Morishige | |
| 7,057,701 B2 | 6/2006 | Chibana et al. | |

(Continued)

FOREIGN PATENT DOCUMENTS

| JP | 2009099917 A | 5/2009 |
|---|---|---|
| KR | 20060113071 A | 11/2006 |
| KR | 20110009187 U | 9/2011 |

OTHER PUBLICATIONS

Internationial Search Report and Written Opinion in International Application PCT/US11/045968 mailed Mar. 22, 2012.

*Primary Examiner* — Steven B McAllister
*Assistant Examiner* — Ko-Wei Lin
(74) *Attorney, Agent, or Firm* — Patterson & Sheridan, LLP (57) ABSTRACT

A method and apparatus for annealing semiconductor substrates is disclosed. The apparatus has an annealing energy source and a substrate support, with a shield member disposed between the annealing energy source and the substrate support. The shield member is a substantially flat member having a dimension larger than a substrate processed on the substrate support, with a window covering a central opening in the substantially flat member. The central opening has a gas inlet portal and a gas outlet portal, each in fluid communication with a gas inlet plenum and gas outlet plenum, respectively. A connection member is disposed around the central opening and holds the window over the central opening. Connection openings in the connection member are in fluid communication with the gas inlet plenum and gas outlet plenum, respectively, through a gas inlet conduit and a gas outlet conduit formed through the connection member.

16 Claims, 3 Drawing Sheets

(56) References Cited

U.S. PATENT DOCUMENTS

| | | |
|---|---|---|
| 7,176,405 B2 | 2/2007 | Shareef et al. |
| 7,538,852 B2 | 5/2009 | Chibana |
| 2006/0060140 A1* | 3/2006 | Lee et al. .................... 118/715 |
| 2009/0314753 A1* | 12/2009 | Kosmowski ............ 219/121.72 |

* cited by examiner

AMBIENT LAMINAR GAS FLOW DISTRIBUTION IN LASER PROCESSING SYSTEMS

CROSS-REFERENCE TO RELATED APPLICATIONS

This application claims benefit of U.S. Provisional Patent Application Ser. No. 61/444,973 filed Feb. 21, 2011, which is herein incorporated by reference.

FIELD

Embodiments disclosed herein relate to methods and apparatus for manufacturing semiconductor devices. More specifically, apparatus and methods of annealing semiconductor substrates are disclosed.

BACKGROUND

Thermal annealing is a commonly used technique in semiconductor manufacturing. A material process is generally performed on a substrate, introducing a material desirous of including in the substrate, and the substrate is subsequently annealed to improve the properties of the materially changed substrate. A typical thermal anneal process includes heating a portion of the substrate, or the entire substrate, to an anneal temperature for a period of time.

During the thermal anneal, the material introduced to the substrate typically migrates through the substrate, but some of the material may volatilize into the vapor space above the substrate. These materials may have elements such as phosphorus, arsenic, and other potentially toxic elements that must be removed from the vapor space before it can be vented into the environment. In addition, atmospheric components, such as oxygen, that react with substrate materials are typically excluded from the processing environment to avoid unwanted reactions with the substrate.

Typically, a chamber enclosure is used to regulate the processing environment and confine any potentially toxic gases from being released. The chamber vapor space is continuously purged with inert gas, which is evacuated into an abatement system, resulting in a large flow of gas to be scrubbed. Additionally, the requirement of using a chamber imposes other restrictions, such as sealing and factory access to the chamber interior, that add cost to the overall system.

Thus, there remains a need for efficient and cost-effective apparatus and methods for regulating the processing environment surrounding substrates undergoing thermal anneal processes.

SUMMARY

An apparatus is disclosed for annealing semiconductor substrates. The apparatus has an annealing energy source and a substrate support, with a shield member disposed between the annealing energy source and the substrate support. The shield member is a substantially flat member having a dimension larger than a substrate processed on the substrate support, with a window covering a central opening in the substantially flat member. The central opening has a gas inlet portal and a gas outlet portal, each in fluid communication with a gas inlet plenum and gas outlet plenum, respectively. A connection member is disposed around the central opening and holds the window over the central opening. Connection openings in the connection member are in fluid communication with the gas inlet plenum and gas outlet plenum, respectively, through a gas inlet conduit and a gas outlet conduit formed through the connection member.

The shield member has two plates fastened together so as to form the gas inlet plenum and gas outlet plenum within the shield member. More than one gas inlet portal and gas outlet portal may be provided in the central opening by forming notches in one plate of the shield member. One set of notches abuts the window to form the gas inlet portals, and another set of notches abuts the other plate to form the gas outlet portals. A plurality of openings is provided through the shield member for flowing gas into the space between the shield member and the substrate or substrate support.

A method of thermally processing a substrate comprises defining a processing zone in a portion of the substrate surface, the processing zone having a dimension smaller than the substrate surface, enclosing the processing zone with a shield member that defines a processing volume proximate the processing zone, flowing a first purge gas through the processing volume, and directing annealing energy through the processing volume to the processing zone. A second purge gas may be provided through openings in the shield member spaced apart from the processing volume, such that the first and second purge gases flow radially outward from the processing volume through the space between the shield member and the substrate support.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
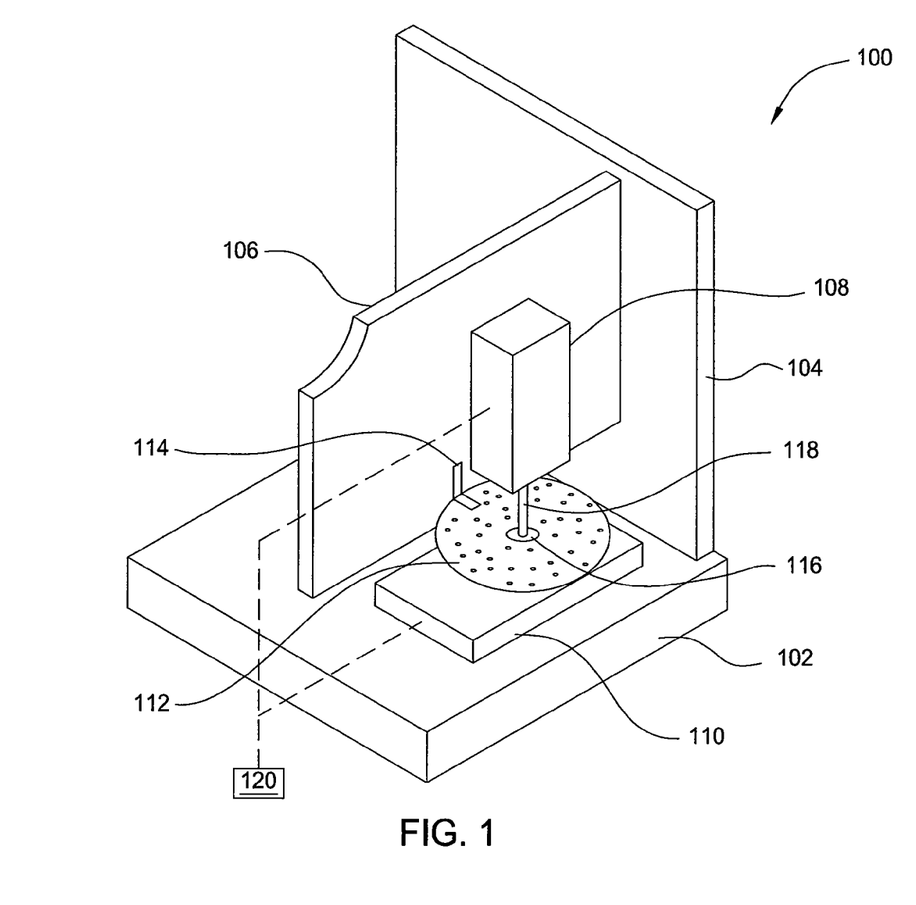
FIG. 1 is an isometric view of an annealing apparatus according to one embodiment.

FIG. 1 is an isometric view of a novel apparatus 100 for thermally annealing a semiconductor substrate. The anneal apparatus 100 has a source of annealing energy 108, a substrate support 110, and a shield member 112 disposed between the substrate support 110 and the source of annealing energy 108. The substrate support 110 may be disposed on a base 102, and the source of annealing energy 108 may be mounted on a support panel 106, which in turn may be mounted on a wall 104 rising from the base 102.

The source of annealing energy 108 may be a radiant source, such as a laser, and generally produces annealing energy 118 that is directed toward the substrate support 110 through an opening 116 in the shield member 112. In one embodiment, the source of annealing energy 108 may comprise two lasers adapted to provide a tailored annealing energy. For example, a first laser may provide a preheat energy while a second laser provides an annealing energy.

The shield member 112 is fastened to the support panel 106 by one or more brackets 114, which hold the shield member 112 in a fixed position with respect to the source of annealing energy 108, such that the annealing energy 118 passes through the opening 116 at all times. The brackets may be configured such that the shield member 112 may be removed for cleaning, if desired, and the same shield member 112, or another substantially identical shield member 112, installed. A substrate disposed on the substrate support 110 is generally larger than the opening 116, but smaller than the shield member 112. Successive portions of the substrate are positioned to receive the annealing energy 118 through the opening 116 by moving the substrate support 110. The substrate support 110 may be a precision x-y stage operated by a controller 120.

Figure 2A:
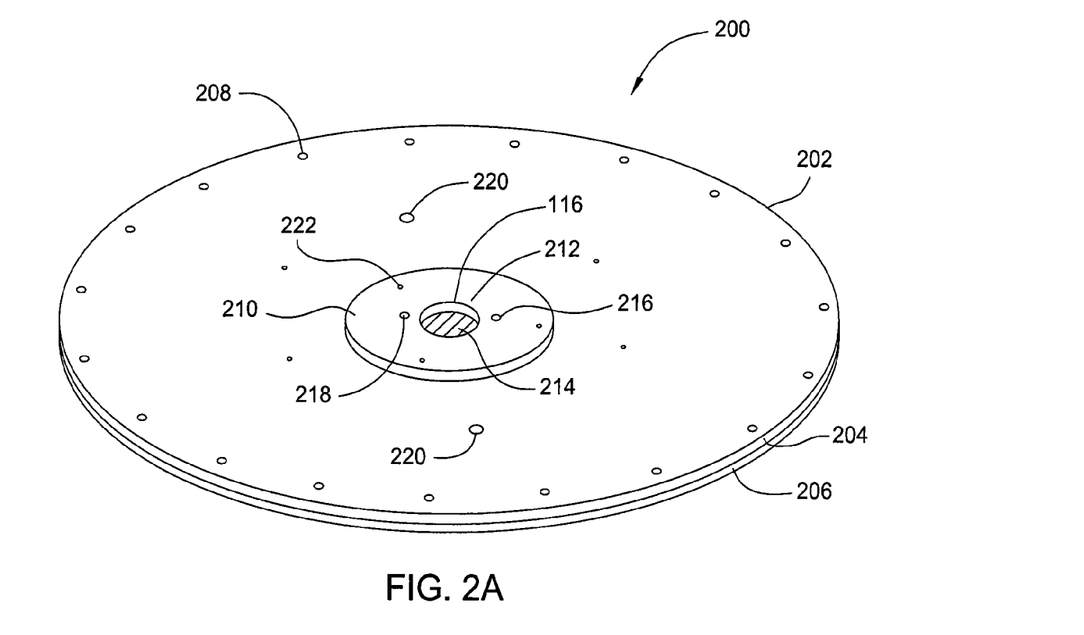
FIG. 2A is a perspective view of a shield member according to another embodiment.

FIG. 2A is a perspective view of a shield member 200 according to another embodiment. The shield member 200 may be used in the apparatus 100 of FIG. 1. The shield member 200 has a substantially flat member 202, formed from a first plate 204 and a second plate 206, which plates may be fastened together by fasteners 208. In one embodiment, threaded holes may be bored to accept screws. Openings 220 in the substantially flat member 202 allow a purge gas to be provided through the substantially flat member 202 to the space between the shield member 200 and a substrate disposed on a substrate support below the shield member, as in FIG. 1.

Although two openings 220 are shown in FIG. 2A, any number may be provided. The openings 220 may be arranged in ranks according to concentric circles, in some embodiments. A shield member 200 having ranks of concentric openings 220, with at least one rank disposed near the central region of the shield member 200 and one rank disposed near the periphery, may support differential pumping of gas from between the shield member 200 and a work surface such as the stage 110 of FIG. 1. Vacuum sources having different flow rates may be coupled to the different ranks to accomplish differential pumping. A vacuum source having a low flow rate may be coupled to a peripheral rank while a vacuum source having a high flow rate may be coupled to a central rank.

The substantially flat member 202 has a central opening 116, as in FIG. 1, that allows annealing energy to pass through the shield member 200 and irradiate a substrate. A window 214 covers the central opening 116 of the substantially flat member 202.

A connection member 210 is disposed around the central opening 116 of the substantially flat member 202, and may attach the window 214 to the first plate 204. The connection member 210 has a central opening 212 that registers with the central opening 116 of the substantially flat member 202. In some embodiments, the central opening 212 of the connection member 210 is coaxial with the central opening 116 of the substantially flat member 202. Additionally, the central opening 212 may have a radius that is substantially the same as a radius of the central opening 116 of the substantially flat member 202. The radius of the central opening 212 may also be larger or smaller than that of the central opening 116 of the substantially flat member 202.

A gas inlet 218 and gas outlet 216 are provided in a surface of the connection member 210 to allow a purge gas to be provided to the space between the window and a substrate disposed on the substrate support, as in FIG. 1 and as described further below. The connection member 210 may be fastened to the substantially flat member 202 using fasteners 222, which may be screws.

Figure 2B:
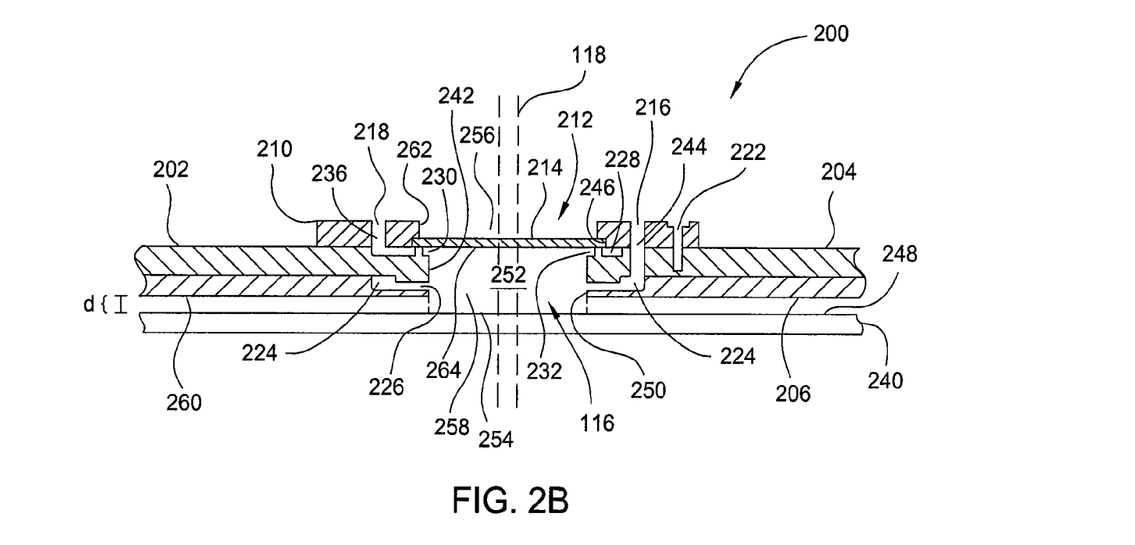
FIG. 2B is a cross-sectional view of the shield member of FIG. 2A.

FIG. 2B is a cross-sectional view of a portion of the shield member 200 of FIG. 2A. The annealing energy 118 from FIG. 1 is shown passing through the window 214 and irradiating a substrate 240. The gas inlet 218 in the surface of the connection member 210 fluidly communicates with a gas inlet conduit 236 and a gas inlet plenum 228, which surrounds the central opening 116. Openings 230 formed in an inner wall 242 of the first plate 204 fluidly communicate with the gas inlet plenum 228 to flow a gas into the central opening 116 proximate the window 214. Dividers 232 are disposed between the openings 230 to provide back-pressure to fill the gas inlet plenum 228, making the openings 230 discrete one from the other. Any number of dividers 232 may be used, depending on the size of the openings 230 desired. The dividers 232 also support the window 214 above the openings 230, bounding the inlet gas flow toward the substrate 240.

The gas outlet 216 in the surface of the connection member 210, which may be an annular member, fluidly communicates with a gas outlet conduit 244 and a gas outlet plenum 224, which also surrounds the central opening 116. In the embodiment of FIG. 2B, the gas outlet plenum has a radius and/or circumference larger than that of the gas inlet plenum 228, but it is not required. The gas outlet plenum 224 is formed as a channel between the first plate 204 and the second plate 206. Openings 226 between the first and second plates 204 and 206 allow gas to flow from the central opening 116 into the gas outlet plenum 224, and then out through the gas outlet conduit 244 and the gas outlet 216.

The central opening 116 has a first end 256 proximate the window 214, and a second end 258 between the first end 256 and the substrate 240. The first and second ends 256 and 258 together define an axis substantially perpendicular to a plane formed by the substantially flat member 202. The openings 230 may be disposed around a circumference of the central opening 116. In the embodiment of FIG. 2A, the openings 230, which may be gas inlet portals, are positioned proximate the first end 256 of the central opening 116, while the openings 226, which may be gas outlet portals, are proximate the second end 258 of the central opening 116. The openings 230 may be coplanar or substantially coplanar, and the openings 226 may also be coplanar or substantially coplanar. Depending on the thickness of the second plate 206 and the size of the openings 226, the openings 226 may be spaced apart from both the first end 256 and the second end 258 of the central opening 116.

The connection member 210 is a substantially continuous member, which may be fastened to the substantially flat member 202 by fasteners 222, which may be screws. In the embodiment of FIG. 2B, the screws are shown extending into the first plate 204, but they may be extended into the second plate 206 as well, thereby further enhancing fastening of the first plate 204 and the second plate 206, if desired. The connection member 210 may have a notch 246 formed in an inner wall 262 thereof to fit the outer edge of the window 214. When fastened down, the connection member 210 holds the window 214 in place over the central opening 116 by operation of the notch 246.

Figure 2C:
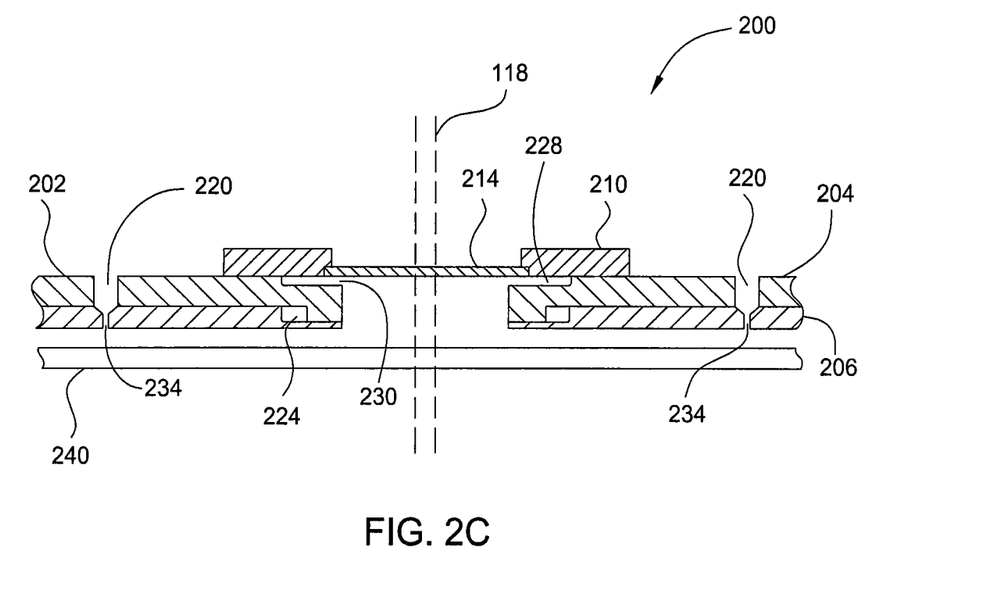
FIG. 2C is a cross-sectional view of the shield member of FIG. 2A along a different section line.

FIG. 2C is a different cross-sectional view of a portion of the shield member 200 of FIG. 2A along a different section line. In this section view, the gas inlet 218, gas outlet 216, gas inlet conduit 236, the gas outlet conduit 244, the openings 226, and the dividers 232 are not visible. The openings 230 form a continuous gas path with the gas inlet plenum 228 in this view. The gas outlet plenum 224 is visible, but separated from the central opening 116 at the location of this section. No openings in the connection member 210 are visible in this section, indicating the continuity of the connection member 210.

The openings 220 formed through the substantially flat member 202 are visible in this view. Each opening 220 communicates with an opening 234 on an opposite face of the substantially flat member 202, providing a conduit through the substantially flat member 202 for gas to flow from one face to the other. Thus, in addition to the gas provided to the central opening 116 of the substantially flat member 202, as shown in FIG. 2B, a gas may be provided to the openings 220 to enhance the gas flow between the shield member 200 and the substrate 240.

In operation, a substrate is positioned on the substrate support facing the shield member 200. A purge gas source is connected to the gas inlet 218 of the connection member 210, and to each of the openings 220 in the substantially flat member 202. The purge gases connected to each location may be the same or different. In one embodiment, a source of nitrogen gas is connected to each location. A vacuum source may be connected to the gas outlet 216.

Purge gas flows through the gas inlet conduit 236 into the gas inlet plenum 228, distributing the purge gas around the central opening 116. The purge gas flows uniformly through the openings 230, radially inward along the substrate-facing surface 264 of the window 214. The purge gas flow curves under pressure to flow toward the substrate 240 near the center of the central opening 116. As the purge gas approaches the substrate 240, the flow curves into a radial outward flow along the exposed surface 248 of the substrate. The radial outward gas flow continues to an outer edge of the shield member 200, which is beyond an outer edge of the substrate 240, maintaining a purge gas flow from the processing zone 254 of the substrate 240 to its perimeter, thus minimizing any intrusion of unwanted gases from the environment into the processing area. Purge gas provided to the openings 220, and flowing through the substantially flat member 202 to the openings 234, enhances the radial outward flow of purge gas, further limiting intrusion of undesired species.

The substrate-facing surface 264 of the window 214, along with the inner wall 242 of the first plate, an inner wall 250 of the second plate, and the exposed surface 248 of the substrate 240 cooperatively define a processing volume 252 above a processing zone 254 of the substrate surface 248. As the annealing energy 118 anneals the substrate surface 248, gases may be released from the substrate surface that are desirous of collection and abatement. A vacuum source may be connected to the gas outlet 216 to establish an outlet flow of purge gas laden with substrate gases emitted into the processing volume 252. Typically, flow of gas to the gas inlet 218 is set to a value larger than the gas flow to the gas outlet 216, under influence of the vacuum source, to maintain the radial outward flow of purge gas from the processing zone 254 to the periphery of the shield member 200, beyond the periphery of the substrate 240. It may be desired, in some embodiments, for a large majority of the purge gas provided to the central opening 116 to be exhausted through the gas outlet 216. In such embodiments, a small flow of purge gas from the processing zone 254 to the periphery of the shield member 200 remains, which is further diluted by purge gas provided through the openings 220. If desired the purge gas flowing to the periphery of the shield member 200 may be collected and subjected to further abatement.

Flow of the purge gas toward the substrate is established by the relative positions of the gas inlet openings 230 and the gas outlet openings 226. It should be noted that reversing the positions of the gas inlet and outlet openings 230 and 226 (or simply reversing connections of gas source and vacuum source) may provide an upward flow in the central opening 116. In some embodiments, a downward flow of purge gas may be preferred to prevent deposition of substrate exudates on the window and resultant clouding of the window. In other embodiments, complete abatement may be desired and achieved by upward flow of purge gas in the central opening. In such embodiments, purge gas provided through the openings 220 of the substantially flat member 202 may flow radially outward and radially inward to accomplish both objectives of preventing intrusion of gases from the environment at the periphery of the shield member 200 and collecting off-gas from the substrate.

It should be noted that providing a gas outlet within the central opening 116 is optional. In some embodiments, the gas inlet openings 230 may provide purge gas to the processing volume 252, and the purge gas may all flow out of the processing volume 252 between the substantially flat member 202 and the substrate.

In other embodiments, a purge gas may be configured to flow across the processing zone 254 of the substrate surface 248 by providing a gas inlet opening on one side of the central opening 116 and a gas outlet on an opposite side of the central opening 116, such that a purge gas provided to the gas inlet will flow linearly across the substrate to the gas outlet, removing any off-gas.

In the embodiments described above in connection with FIGS. 2B and 2C, the openings 230 are formed in alignment with a radius of the central opening 116, such that gas flowing through the openings 230 flows initially inward along the radius toward the center of the central opening 116. If desired, a circular flow or vortex flow may be provided by forming the openings 230 along an axis angled with respect to a radius drawn through a center of each opening 230 in the plane of the substantially flat member 202, such that gas flowing through each opening 230 has an angular flow component as well as a radial flow component. If desired, the openings 230 may be formed with an axial angle, as well, to provide an axial flow component, either toward the window 214 or toward the substrate 240. Such flow patterns may be useful in avoiding local concentrations of off-gas that may be harmful to components of the shield member 200.

The substantially flat member 202 may be aluminum, or any structural material unlikely to affect substrates adversely. The connection member 210 may be a polymer, such as plastic or ceramic, such as alumina, and may be a refractory material, if desired.

The shield member 200 is typically larger than the substrate 240, in some cases much larger. A ratio of the areal extent of the shield member 200 to the areal extent of the substrate 240 is between about 2 and about 10, for example about 5. The shield member 200 thus functions like a "semi-infinite" plate, relative to the substrate 240, for establishing an outward gas flow field. This provides a relatively large managed atmosphere between the shield member 200 and the substrate support 110 (FIG. 1) within which the substrate 240 moves as the anneal proceeds. In an embodiment for processing 300 mm wafers, the shield member 200 may have a diameter between about 500 mm and about 1,000 mm, for example about 700 mm.

A distance "d" between the substrate surface 248 and a lower surface 260 of the shield member 200 is typically much smaller than a dimension (e.g. diameter, radius, diagonal length) of the substrate 240. A ratio of the dimension of the substrate to the distance "d" is typically between about 50:1 and about 200:1, for example about 100:1. For an exemplary 300 mm circular substrate, the distance "d" may be about 3 mm. For most embodiments, the distance "d" is between about 1 mm and about 20 mm, such as between about 2 mm and about 10 mm. A small distance "d", relative to the substrate 240 dimension, affords a uniformly brisk flow of purge gas from the processing zone 254 of the substrate 240 to the periphery thereof, maximizing exclusion of environmental gases from the processing volume 252.

The central opening 116 is generally sized to accommodate the type and dimension of the annealing energy 118 admitted therethrough. In an embodiment using a shaped annealing energy, such as a laser anneal embodiment having an anneal beam with an optically defined shape, the central opening may be sized and shaped with minimal edge clearance relative to the anneal beam. For example, if the anneal beam has dimension of 10 mm×30 mm, the central opening 116 may have dimension of 11 mm×31 mm. Such sizing may minimize substrate off-gas contacting the window 214. In other embodiments, the central opening 116 may be shaped as a cylindrical hole, as shown in FIGS. 1-2C, and may have a radius between about 10 mm and about 100 mm, for example about 25 mm. As mentioned above, the central opening 212 of the connection member 210 may be the same size and shape as the central opening 116 of the substantially flat member 202, or a different size and shape. It is preferred that the central opening 212 of the connection member 210 be larger than the annealing energy 118 passing through the window 214 to avoid thermal degradation of the connection member 210.

In one embodiment, the substantially flat member has a thickness between about 50 mm and about 250 mm, such as between about 100 mm and about 200 mm, for example about 125 mm. Each of the first plate 204 and the second plate 206 has a thickness approximately half the thickness of the substantially flat member 202, such that the thicknesses of the first and second plates 204 and 206 are approximately equal, except near the central opening 116.

The openings 230 may be formed as rectangular openings oriented along radii of the central opening 116, and may have dimension in the angular direction between about 0.1 mm and about 5 mm, such as between about 0.5 mm and about 2.0 mm, for example about 1.0 mm. The dimension of the openings 230 in the axial direction (along the axis of the central opening 116) may be between about 0.1 mm and about 5 mm, such as between about 0.5 mm and about 2.0 mm, for example about 1.0 mm. As such, the openings 230 may be substantially square in shape. It should be noted that the openings 230 may have any convenient shape in cross-section, such as rectangular, circular, oval, or any polygonal or irregular shape that may be desired. The openings 226 may be sized and shaped the same as the openings 230, or according to any size and shape to achieve a desired fluid flow.

The inlet and outlet gas plenums 228 and 224, respectively, have dimensions in general flow agreement with dimensions of the openings 230 and 226, respectively. In one embodiment, the inlet and outlet gas plenums 228 and 224 are channels having a generally rectangular cross-section and surrounding the central opening in an annular fashion. The channels have a width between about 0.1 mm and about 5 mm, such as between about 0.5 mm and about 4 mm, for example about 2.0 mm. A central axis of the gas inlet plenum 228 may be spaced apart from the wall 242 of the central opening 116 between about 1.0 mm and about 10 mm, for example about 5 mm, while the central axis of the gas outlet plenum 224 may be spaced apart from the wall 242 of the central opening 116 between about 1.0 mm and about 10 mm, for example about 6 mm. It should be noted that the two plenums 228 and 224 may be spaced the same distance from the wall 242 if one of the gas conduits 236 and 244 is angled to avoid conflict with a plenum.

Axial distance between the openings 230 and the openings 226 is related to thickness of the substantially flat member 202, in the embodiments of FIG. 1-2C, because the openings 226 are formed by space between the two plates 204 and 206. In one embodiment, the openings 230 and 226 are spaced apart between about 50 mm and about 250 mm, such as between about 80 mm and about 120 mm, for example about 100 mm.

The connection member 210 may have thickness between about 50 mm and about 500 mm, such as between about 100 mm and about 200 mm, for example about 125 mm. The connection member 210 may have a thickness selected to define a distance between the window 214 and the substrate 240. The distance between the window 214 and the substrate 240 may be increased, if desire, to reduce deposition of substrate exudates on the window 214 in some embodiments. The gas inlet and outlet conduits 236 and 244, respectively, and the respective gas inlet and outlet 218 and 216, are also sized in flow agreement with the other components of the purge gas circuit, with diameter of each typically between about 1.0 mm and about 10 mm, such as between about 3 mm and about 7 mm, for example about 5 mm. The outer radius of the connection member 210 is selected provide space for the gas inlet and outlet 218 and 216, respectively, and for the fasteners 222. In one embodiment, the outer radius of the connection member 210 is between about 50 mm and about 150 mm, such as between about 75 mm and about 125 mm, for example about 100 mm.

The purge gas openings 220 formed in the substantially flat member 202 are generally spaced between the central opening 116 and the periphery of the shield member 200. In one embodiment, the purge gas openings 220 are spaced from the center of the shield member 200 a distance between about 50 mm and about 400 mm, such as between about 100 mm and about 200 mm, for example about 150 mm.

The window 214 is typically positioned further from the substrate surface 248 than the lower surface 260 of the substantially flat member 202 to avoid unwanted deposition on, and clouding of, the window 214. For this reason, the thickness of the connection member 210 may be adjusted to provide the desired elevation. In one embodiment, a ratio of the distance between the window 214 and the substrate surface 248 to the distance between the lower surface 260 and the substrate surface 248 is between about 10:1 and about 100:1, such as between about 15:1 and about 50:1, for example about 16:1. In an embodiment wherein the distance "d" is about 3 mm, the window 214 may be spaced apart from the substrate surface 248 at least about 50 mm.

In one embodiment, the shield member 200 may provide a heat shield for components that may be sensitive to radiation. In some embodiments, a substrate disposed on the substrate support facing the shield member 200 may be heated. Radiation emitted by the heated substrate may damage optical instruments arranged to tune the energy 118 directed toward the substrate or arranged to monitor the condition of the substrate. If the shield member 200 is located between the substrate and the optics, the shield member 200 may be cooled, for example by flowing a cooling medium through channels formed between the two plates 204 and 206, to reduce radiation absorbed by the optics.

As described above, the substrate may emit byproducts during thermal processing. If such byproducts are deposited on the shield member 200, as may happen particularly if the shield member 200 is cooled, the shield member 200 may be removably attached to a support member such as the support 106 of FIG. 1. The shield member 200 may then be quickly removed or swapped for cleaning.

A method of annealing a semiconductor substrate includes positioning the substrate on a substrate support facing a source of annealing energy and disposing a shield member between the substrate and the energy source. A central opening is provided in the shield member to admit the annealing energy through to the substrate. A projection of the central opening onto the substrate surface defines a processing zone on the substrate surface. A window is provided covering the opening and the processing zone, and together with an inner wall of the central opening and the substrate surface opposite the window, defines a processing volume around the processing zone. The shield member described above in connection with FIGS. 1-2C may be used to perform this method.

A purge gas is flowed through the processing volume, and may be partially or completely evacuated from the processing volume by applying a vacuum source. Purge gas not evacuated from the processing volume may be allowed to flow out of the processing volume through a space between the substrate and the shield member. A second purge gas may be provided to the space between the substrate and the shield member, at a location between the center and the periphery of the shield member, to enhance the radial flow of purge gas. Radial flow of purge gas outward from the center to the periphery prevents intrusion of unwanted gases from the environment into the processing volume.

In a typical anneal process for a 300 mm wafer, a purge gas may be provided through the connection member at a purge gas feed flow rate between about 10 sLm and about 50 sLm, such as between about 20 sLm and about 40 sLm, for example about 30 sLm. A vacuum source may be configured to draw a flow rate of purge gas between about 10% and about 110% of the purge gas feed flow rate, such as between about 40% and about 99% of the purge gas feed flow rate, for example about 90% of the purge gas feed flow rate. The second purge gas provided to the peripheral openings 220 may be provided at a flow rate between about 5 sLm and about 50 sLm for each opening 220, such as between about 10 sLm and about 30 sLm per opening, for example about 15 sLm per opening. Purge gases suitable for most embodiments include nitrogen gas, argon, helium, hydrogen, other inert or noble gases, and mixtures thereof. The first purge gas provided to the connection member may be the same as, or different from, the second purge gas provided to the peripheral openings of the substantially flat member.

Annealing energy is directed through the window to the substrate surface to anneal a portion of the substrate surface in the processing zone. The substrate may be moved according to any desired pattern to successively anneal portions of the substrate surface. The entire substrate surface may be annealed in this sequential fashion, if desired.

The shield member described herein in various embodiments is useful for controlling the atmosphere of the processing volume proximate the processing zone of the substrate by excluding environmental gases from the processing volume. It should be noted that some embodiments in which such a shield member is used may utilize a reactive atmosphere, rather than an inert atmosphere. In such embodiments, a reactive gas mixture, for example a gas mixture including oxygen gas, ammonia, or another reactive gas, may be provided through the gas inlet openings 230.

A shield member, as described herein in connection with FIGS. 1-2C, may be made by machining two plates of desired thickness. Two aluminum plates having a desired diameter may be bored through the center to form a central opening such as the central opening 116 of FIG. 1. The second plate 206 may be fashioned by machining a circular or annular groove a desired distance from the central opening, and then machining the openings 226 from the wall of the central opening along a radius to the annular groove. The first plate 204 may be fashioned by machining away a portion of the thickness of the plate outside a selected radius from the center, the selected radius being smaller than the radius of the annular groove formed in the second plate 206. The first plate 204 may then be inverted, and the openings 230 formed in the upper surface thereof according to a process similar to that used for the openings 226. The gas inlet and outlet conduits 236 and 244 are bored into the two plates at selected locations, according to the depths of the annular spaces formed by the two plates. The two plates 204 and 206, thus formed, may be bored for fasteners, and the openings 220 bored through the plates. The connection member 210 may be formed by molding plastic or ceramic, or a disk shaped plastic or ceramic member may be worked with an abrasion tool to form the central opening, notch, gas conduits, and fastener bores.

Other channels and bores may be provided in the first and second plates 204 and 206, if desired, to accommodate thermal control fluids, such as cooling fluids, cooperatively defining thermal control fluid conduits. Any channel configuration may be machined into the plates to form a cooling channel, if desired, to give the shield member heat shield properties. Such capabilities may be useful for embodiments in which a substrate is subjected to background heating.

Embodiments described herein provide a shield for a thermal annealing apparatus, the shield having a substantially flat member, which may be constructed from a material having metal, such as aluminum, with a central opening defined by a wall, the wall having a gas inlet portal and a gas outlet portal, the gas inlet portal in fluid communication with a gas inlet conduit formed in the member, and the gas outlet portal in fluid communication with a gas outlet conduit formed in the member.

The substantially flat member may have a first plate, a second plate, and a window covering the central opening. The window may cover the central opening at the first plate, and the gas inlet and outlet conduits may extend to openings in the first plate. The central opening may have a first end and a second end that together define an axis substantially perpendicular to a plane defined by the substantially flat member, with plurality of gas inlet portals, which may be substantially coplanar, connected by a first channel formed between the first plate and an annular member that attaches the window to the first plate and a plurality of gas outlet portals, which may also be substantially coplanar, connected by a second channel formed between the first plate and the second plate, wherein the first channel is in fluid communication with the gas inlet portals and the second channel is in fluid communication with the gas outlet portals.

The gas inlet portals may be disposed around a circumference of the central opening, and may be in fluid communication with a gas inlet plenum. The gas outlet portals may be disposed around a circumference of the central opening, and may be in fluid communication with a gas outlet plenum, which may have a circumference larger than a circumference of the gas inlet plenum.

A connection member, for example a fastener, which may be a polymer, may be fastened to the substantially flat member. The connection member may be annular and coaxial with the central opening, and the window may be disposed between the connection member and the substantially flat member. The connection member may have a central opening of substantially the same dimension as the central opening of the substantially flat member.

While the foregoing is directed to embodiments of the invention, other and further embodiments of the invention may be devised without departing from the basic scope thereof.

What is claimed is:

1. A shield for a thermal annealing apparatus, comprising:
   a substantially flat member having:
      a central opening through the substantially flat member, the central opening having a wall with a gas inlet portal and a plurality of gas outlet portals, the gas inlet portal in fluid communication with a gas inlet conduit and a gas inlet plenum formed in the substantially flat member, and the gas outlet portals in fluid communication with a gas outlet conduit and a gas outlet plenum formed in the substantially flat member, wherein the central opening has a first end at a first surface of the substantially flat member and a second end at a second surface of the substantially flat member opposite the first surface that together define an axis substantially perpendicular to the substantially flat member, and wherein the gas inlet portal is positioned proximate the first end of the central opening and the gas outlet portals are spaced apart from the first and second ends of the central opening and are spaced apart from the gas inlet portal along the axis.

2. The shield of claim 1, further comprising a window covering the central opening, wherein the substantially flat member comprises a first plate and a second plate, the window covers the central opening at the first plate, and the gas inlet and outlet conduits extend to openings in the first plate, wherein dividers are disposed between the openings.

3. The shield of claim 2, wherein:
   the gas inlet portal is connected by the gas inlet plenum formed between the first plate and an annular connection member that attaches the window to the first plate, wherein the annular connection member is plastic or ceramic, and
   the plurality of gas outlet portals are connected by the gas outlet plenum formed between the first plate and the second plate.

4. The shield of claim 1, further comprising an annular connection member attached to the substantially flat member in a coaxial relationship, and a window disposed between the substantially flat member and the annular connection member and covering the central opening.

5. The shield of claim 3, wherein the plurality of gas outlet portals are substantially coplanar.

6. The shield of claim 5, wherein the gas inlet portal is in fluid communication with the gas inlet plenum disposed around the central opening, and the gas outlet portals are in fluid communication with the gas outlet plenum disposed around the central opening, and wherein the gas outlet plenum has a larger circumference than the gas inlet plenum.

7. An apparatus for annealing a semiconductor substrate, comprising:
   an annealing energy source;
   a substrate support having a substrate receiving surface facing the annealing energy source; and
   a shield member between the annealing energy source and the substrate receiving surface, the shield member comprising a substantially flat member having a central opening through the substantially flat member, a wall around the central opening with a gas inlet portal and a plurality of gas outlet portals in the wall, the gas inlet portal in fluid communication with a gas inlet conduit and a gas inlet plenum formed in the substantially flat member, the gas outlet portals in fluid communication with a gas outlet conduit and a gas inlet plenum formed in the substantially flat member, wherein the central opening has a first end and a second end that together define an axis substantially perpendicular to the substantially flat member, and wherein the gas inlet portal is positioned proximate the first end of the central opening and the gas outlet portals are spaced apart from the first and second ends of the central opening and are spaced apart from the gas inlet portal along the axis.

8. The apparatus of claim 7, wherein the central opening is covered by a window, and wherein the central opening, window, and substrate receiving surface cooperatively define a processing volume.

9. The apparatus of claim 8, wherein the substantially flat member comprises a first plate and a second plate, each plate having grooves that cooperatively define thermal control fluid conduits.

10. The apparatus of claim 7, wherein the shield member has a dimension larger than a dimension of the substrate receiving surface.

11. The apparatus of claim 7, further comprising an annular connection member attached to the substantially flat member in a coaxial relationship, and a window disposed between the substantially flat member and the annular connection member and covering the central opening.

12. An apparatus for annealing a semiconductor substrate, comprising:
    an annealing energy source;
    a substrate support having a substrate receiving surface facing the annealing energy source;
    a shield member between the annealing energy source and the substrate receiving surface, the shield member comprising:
       a substantially flat member having a dimension larger than the substrate receiving surface and a central opening through the substantially flat member, the central opening having a wall with a gas inlet portal and a plurality of gas outlet portals, wherein the central opening has a first end and a second end that together define an axis substantially perpendicular to the substantially flat member, and wherein the gas inlet portal is positioned proximate the first end of the central opening and the gas outlet portals are spaced apart from the first and second ends of the central opening and are spaced apart from the gas inlet portal along the axis;
       a gas inlet conduit and a gas inlet plenum formed in the member in fluid communication with the gas inlet portal;
       a gas outlet conduit and a gas outlet plenum formed in the member in fluid communication with the gas outlet portals;
       an annular connection member attached to the substantially flat member in a coaxial relationship; and a window disposed between the substantially flat member and the annular connection member, the window covering the central opening.

13. The shield of claim 2, wherein the openings are formed along an axis angled with respect to a radius drawn through a center of each opening.

14. The apparatus of claim 7, wherein the annealing energy source is capable of providing an anneal beam with a circumference smaller than a circumference of the central opening.

15. The apparatus of claim 7, wherein a ratio of a first distance between the window and the substrate receiving surface to a second distance between the substantially flat member and the substrate receiving surface is between a ratio of about 10:1 and a ratio of about 100:1.

16. The apparatus of claim 1, wherein the substantially flat member further comprises:
- a plurality of purge gas openings in the substantially flat member, comprising a first rank of purge gas openings and a second rank of purge gas openings to maintain a radial outward flow of purge gas toward the periphery of the substantially flat member.

\* \* \* \* \*